US009553086B2

(12) United States Patent
Storasta et al.

(10) Patent No.: US 9,553,086 B2
(45) Date of Patent: Jan. 24, 2017

(54) REVERSE-CONDUCTING SEMICONDUCTOR DEVICE

(71) Applicant: ABB Schweiz AG, Zurich (CH)

(72) Inventors: Liutauras Storasta, Lenzburg (CH); Chiara Corvasce, Bergdietikon (CH); Manuel Le-Gallo, Wallisellen (CH); Munaf Rahimo, Uezwil (CH)

(73) Assignee: ABB SCHWEIZ AG (CH)

( * ) Notice: Subject to any disclaimer, the term of this patent is extended or adjusted under 35 U.S.C. 154(b) by 0 days.

(21) Appl. No.: 15/191,295

(22) Filed: Jun. 23, 2016

(65) Prior Publication Data

US 2016/0307888 A1    Oct. 20, 2016

Related U.S. Application Data

(63) Continuation of application No. PCT/EP2014/079007, filed on Dec. 22, 2014.

(30) Foreign Application Priority Data

Dec. 23, 2013    (EP) ..................................... 13199429
Apr. 3, 2014    (EP) ..................................... 14163376

(51) Int. Cl.
*H01L 29/74* (2006.01)
*H01L 27/06* (2006.01)
(Continued)

(52) U.S. Cl.
CPC ....... *H01L 27/0635* (2013.01); *H01L 29/0692* (2013.01); *H01L 29/0804* (2013.01);
(Continued)

(58) Field of Classification Search
CPC ............. H01L 27/0635; H01L 29/0692; H01L 29/0804; H01L 29/0821; H01L 29/0847; H01L 29/1004; H01L 29/417; H01L 29/7395

See application file for complete search history.

(56) References Cited

U.S. PATENT DOCUMENTS

| 8,212,283 B2 | 7/2012 | Storasta et al. |
| 2010/0156506 A1 | 6/2010 | Tsuzuki et al. |
| 2011/0204414 A1* | 8/2011 | Kopta ................ H01L 29/0696 257/140 |

FOREIGN PATENT DOCUMENTS

| DE | 102005019178 A1 | 11/2006 |
| JP | 2009099690 A | 5/2009 |

OTHER PUBLICATIONS

Storasta, L., et al., The Radial Layout Design Concept for the Bi-mode Insulated Gate Transistor, Proceedings of the 23rd International Symposium on Power Semiconductor Devices & IC's, May 23-26, 2011, pp. 56-69.

(Continued)

*Primary Examiner* — Victor A Mandala
*Assistant Examiner* — Colleen E Snow
(74) *Attorney, Agent, or Firm* — Taft Stettinius & Hollister LLP

(57) ABSTRACT

A Reverse-conducting semiconductor device which comprises a freewheeling diode and an insulated gate bipolar transistor on a common wafer, part of which wafer forms a base layer of a first conductivity type with a first doping concentration and a base layer thickness. The insulated gate bipolar transistor comprises a collector side and an emitter side opposite the collector side of the wafer. A cathode layer of a first conductivity type with at least one first region and a anode layer of a second conductivity type with at least one second and pilot region are alternately arranged on the collector side. Each region has a region area with a region
(Continued)

width surrounded by a region border. The Reverse-conducting-IGBT of the present application satisfies a number of specific geometrical rules.

20 Claims, 11 Drawing Sheets

(51) Int. Cl.
*H01L 29/10* (2006.01)
*H01L 29/08* (2006.01)
*H01L 29/417* (2006.01)
*H01L 29/06* (2006.01)
*H01L 29/739* (2006.01)

(52) U.S. Cl.
CPC ...... *H01L 29/0821* (2013.01); *H01L 29/0847* (2013.01); *H01L 29/1004* (2013.01); *H01L 29/417* (2013.01); *H01L 29/7395* (2013.01)

(56) References Cited

OTHER PUBLICATIONS

Jayant, Baliga, Power Semiconductor Devices, Chapter 8; Insulated Gate Bipolar Transistor, Jan. 1, 1995, pp. 431-432.
European Search Report, EP14163376, ABB Technology AG, Oct. 29, 2014, 9 pages.
International Search Report and Written Opinion, PCT/EP2014/079007, May 8, 2015, 11 pages.

* cited by examiner

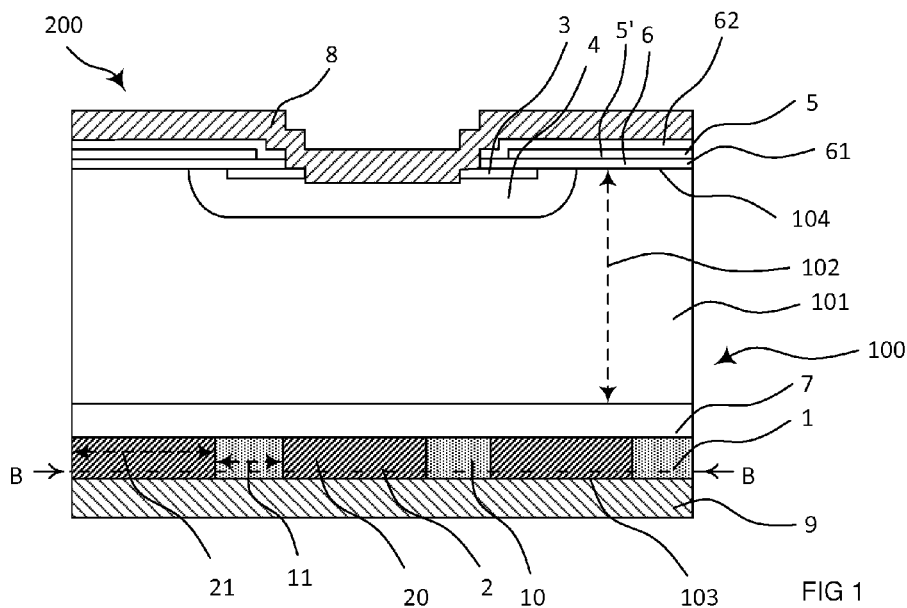
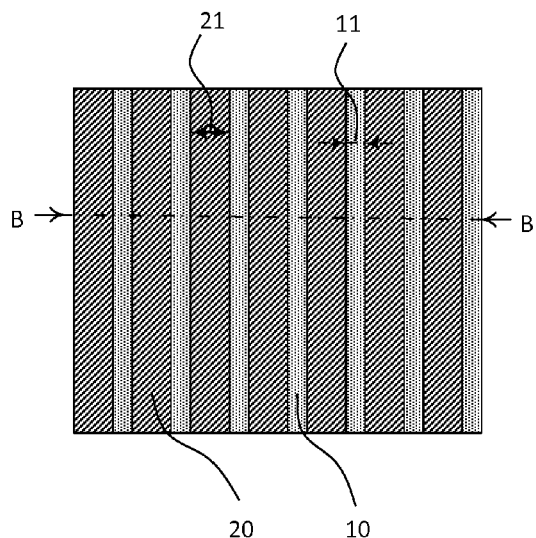
FIG 2
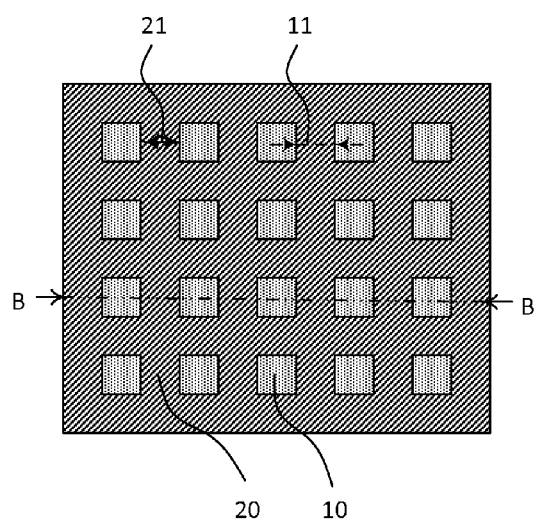
FIG 3
FIG 1

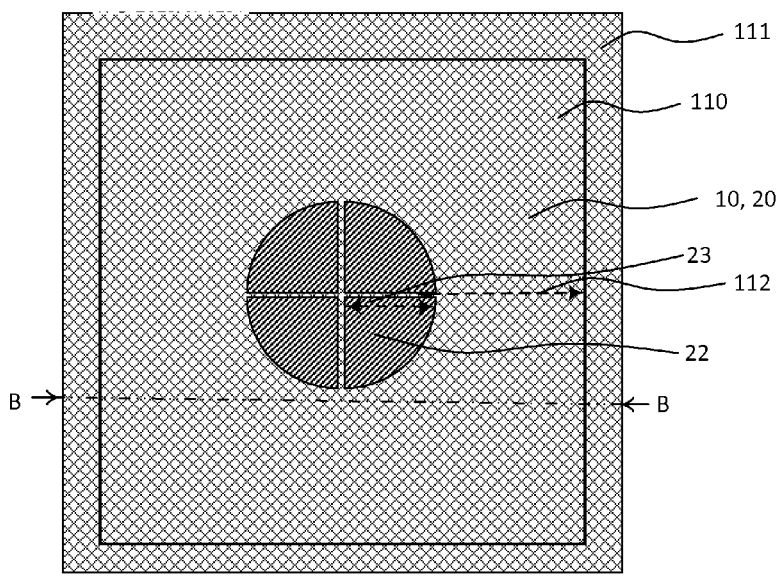
FIG 16
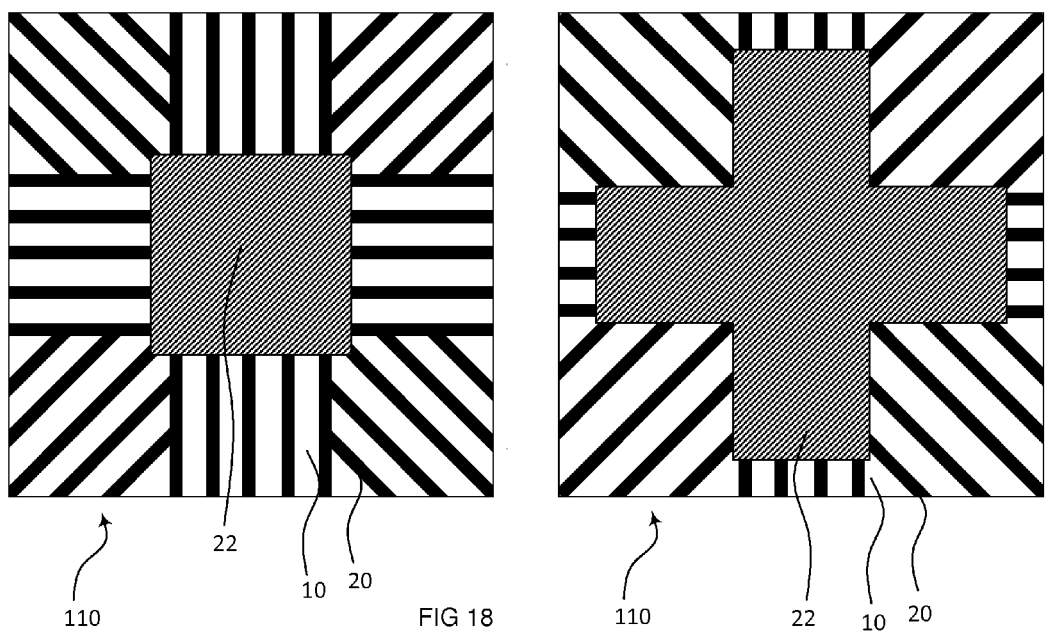
FIG 18
FIG 19

REVERSE-CONDUCTING SEMICONDUCTOR DEVICE

TECHNICAL FIELD

The invention relates to the field of power electronics and more particularly to a reverse-conducting semiconductor device according to the preamble of claim 1.

BACKGROUND ART

In U.S. Pat. No. 8,212,283 B2 a prior art reverse-conducting insulated gate bipolar transistor (RC-IGBT) in form of a Bi-mode Insulated Gate Transistor (BIGT) as described (shown in FIG. 1), which comprises a freewheeling diode and an insulated gate bipolar transistor (IGBT) on a common wafer 100, part of which wafer forms an (n−) doped base layer 101 with a first doping concentration and a base layer thickness 102. The RC-IGBT comprises a collector side 103 and an emitter side 104, whereas the collector side 103 is arranged opposite of the emitter side 104 of the wafer 100.

The base layer thickness 102 is the maximum vertical distance between the collector and emitter side 103 and 104 of that part of the wafer 100 with the first doping concentration.

An n doped cathode layer 1 of higher doping concentration than the first doping concentration and a p doped anode layer 2 are alternately arranged on the collector side 103. The cathode layer 1 comprises at least one or a plurality of first regions 10, wherein each first region 10 has a first region width 11.

The anode layer 2 comprises at least one or a plurality of second regions 20 and at least one or a plurality of pilot regions 22, wherein each second region 20 has a second region width 21 and each pilot region 22 has a pilot region width 23.

Any region (first, second or pilot region) has a region width and a region area, which is surrounded by a region border.

In an exemplary embodiment, a shortest distance is the minimum length between a point within said region area and a point on said region border. In that exemplary embodiment, each region width is defined as two times the maximum value of any shortest distance within said region.

An n doped source region 3, a p doped well layer 4 and a gate electrode having an electrically conductive gate layer 5 and an insulating layer 6, which insulates the gate layer 5 from any doped layer and an emitter electrode 8, are arranged at the emitter side 104.

The reverse-conducting semiconductor device comprises an active region 110, which is an area in the wafer 100, which includes and is arranged below any of the source region 3, well layer 4 or gate layer 5.

The following geometrical rules have to be fulfilled:
each pilot region area is a p doped area, in which a maximum value of all shortest distances to any border point is bigger than the base layer thickness 102,
the at least one pilot region 22 is arranged in the central part of the active region 110 in such a way that there is a minimum distance between the pilot region border to the active region border of at least one time the base layer thickness 102,
at least one second region 20 is that part of the anode layer 2, which is not the at least one pilot region 22,
the total area (sum of the areas) of the at least one pilot region 22 is between 10 and 30% of the active region 110,
each first region width 11 is smaller than the base layer thickness 102.

The pilot region 22 represents a pilot IGBT region, which eliminates snap-back effects at low currents. The snap-back effect of a BIGT depends on the resistance of the base layer, which in turn depends on the resistivity and thickness of the base layer 102. For devices having a greater base layer thickness 102, the voltage drop across the base layer is larger. Therefore, also the total on-state voltage drop is higher for such devices, and snap-back effect occurs at higher voltages.

The introduction of a sufficiently large p doped region (pilot region) can avoid such snap-back effect in a high voltage IGBT device. A minimum distance between this pilot region 22 and the border of the active region 110 is essential for good thermal performance and improvement of the device SOA since the pilot IGBT does not include transition parts of the chip such as those from active to termination regions 111. Furthermore, by using a pilot region 22, snap-back behaviour is improved compared to distributed smaller pilot regions.

By introducing a larger pilot region 22 compared to the smaller second regions 20, large areas of the device with shorted structures are maintained. By the introduction of the pilot region 22 with much increased dimensions compared to the first and second regions 10, 20, a region is created which is dedicated solely as IGBT region and not operating in the diode mode. The p-type pilot region 22 ensures increased IGBT area. The pilot region 22 is mainly present to give more freedom to determine the IGBT to diode area ratio and decouple this design aspect from the standard approach involving the small second regions 22 only.

The pilot region 22 is surrounded by shorted regions with alternating first and second doped regions 10, 20 (mixed region). Since the small first and second regions 10, 20 do not heavily influence the IGBT snap-back mode in line with the above design rule, their dimensions are adjusted to achieve the required diode area.

The first and second regions 10, 20 form the main shorted region in which the silicon area included is utilized in both IGBT and diode mode. These regions also influence the main IGBT electrical properties.

However, prior art RC-IGBTs have a snap-back in their on-state characteristics as a result of anode shorting. In the case of the prior art BIGT the initial snap-back is minimized or even removed by providing a large pilot region 22 in the center of the device. Consequently the injected carrier distribution becomes uneven in the BIGT having a wide anode in the pilot area and a strongly shorted anode in the mixed region.

During the IGBT mode conduction, the carrier plasma has its highest density in the active region 110 above the middle of the projection of the pilot region 22. As a result, during IGBT-mode conduction the temperature at the center of the chip is increased compared to what is normally seen in prior art IGBTs. Therefore, during the IGBT-mode turn-off the dynamic avalanche sets early at the cells located above the center of the widest/largest anode area, which is the pilot-IGBT region 22. This effect is mainly pronounced when the plasma is inhomogeneously distributed between the pilot-IGBT region 22 and the shorted region 10, 20. This happens mainly at lower temperatures (room temperature) and low currents up to the nominal current. The dynamic avalanche contributes to the increased turn-off losses during these conditions and creates concerns regarding the reliability of the component continuously operating in dynamic avalanche mode. The effect becomes gradually less as the current increases and the shorted regions 10,20 are flooded with carriers, but nevertheless the maximum turn-off capability of the BIGT is reduced compared to a corresponding prior art RC-IGBT.

FIGS. 20 and 21 show the carrier plasma (hole density) concentration in a semiconductor device in a plane located 5 μm from the emitter during IGBT mode turn-off. The hole density is shown at three different voltages of 500 V, 1200 V and 1900 V. FIG. 20 shows the hole density for a prior art BIGT structure, and on the right side a prior art RC IGBT structure is shown.

In the prior art BIGT structure (FIG. 20) dynamic avalanche occurs (seen as a filament of high plasma concentration) in the middle of the Pilot region (at the position −250 μm). The RC IGBT without a pilot-IGBT region as shown in FIG. 21 shows a smoother behavior without dynamic avalanche.

FIG. 22 shows an example of a prior art BIGT turn-off waveform showing the onset of dynamic avalanche detected as the change (slowing down) of the dV/dt rate.

DISCLOSURE OF INVENTION

It is an object of the invention to provide a bi-mode insulated gate transistor with improved switching performance with less dynamic avalanche during turn-off, having improved maximum turn-off capability.

This object is achieved by a reverse-conducting semiconductor device according to claim 1.

The inventive reverse-conducting insulated gate bipolar transistor (RC-IGBT) comprises a freewheeling diode and an insulated gate bipolar transistor (IGBT) on a common wafer, part of which wafer forms a base layer of a first conductivity type with a first doping concentration and a base layer thickness. The insulated gate bipolar transistor comprises a collector side and an emitter side, whereas the collector side is arranged opposite of the emitter side of the wafer.

The base layer thickness is the maximum vertical distance between the collector and emitter side of that part of the wafer with the first doping concentration. The base layer thickness is the thickness as shown in FIG. 1 by the dashed line.

A cathode layer of the first conductivity type and higher doping concentration than the first doping concentration and a anode layer of a second conductivity type are alternately arranged on the collector side. The cathode layer comprises at least one or a plurality of first regions, wherein each first region has a first region width.

The anode layer comprises at least one or a plurality of second and at least one or a plurality of pilot regions, wherein each second region has a second region width and each pilot region has a pilot region width.

Any region (first, second or pilot region) has a region width and a region area, which is surrounded by a region border.

In an exemplary embodiment, a shortest distance is the minimum length between a point within said region area and a point on said region border. In that exemplary embodiment, each region width is defined as two times the maximum value of any possible shortest distances within said region, i.e. the maximum value of all shortest distances available in the pilot region.

At the emitter side, a source region of the first conductivity type, a well layer of the second conductivity type and a gate electrode having an electrically conductive gate layer and an insulating layer, which insulates the gate layer from any doped layer and the emitter electrode, are arranged.

The reverse-conducting semiconductor device comprises an electrically active region in a central part of the device, which active region is an area in the wafer, which includes and is arranged below (i.e. in projection of) any of the source region, well layer or gate layer. Towards the collector side, depending on the design of the collector electrode and the first and second regions on the collector side, the carrier plasma might spread beyond the active region as defined above, but for the purpose of this patent application, the active region shall be restricted to the area below the source region, well layer or gate layer, i.e. excluding any lateral spreading of the carrier plasma towards the collector side.

The following geometrical rules have to be fulfilled:
  each pilot region area is an area of the second conductivity type, in which a maximum value of any (i.e. all possible) shortest distances to any border point is bigger than two times the base layer thickness, i.e. the pilot region width is larger than twice the base layer thickness, wherein the pilot region is laterally surrounded on the pilot region border by first regions, which have a distance from each other of less than two times the base layer thickness,
  the at least one pilot region is arranged in the central part of the device in such a way that the mixed region laterally surrounds the at least one pilot region, exemplarily the width of the mixed region (distance between the border of the pilot region to the interface between active region and termination region) being at least one time the base layer thickness, exemplarily twice the base layer thickness,
  at least one second region is that part of the anode layer, which is not the at least one pilot region,
  the total area of the at least one pilot region is between 10 and 45% of the area of the mixed region,
  each first region width is smaller than the base layer thickness.

The central part of the device extends form the emitter to the collector side and is surrounded by a termination area. The pilot region is a p doped area, around which first and second regions are arranged. The first regions are arranged such that across the pilot region, they have a distance bigger than two times the base layer thickness. The distance to the next neighboured first regions (i.e. on the border to the pilot region) may be much smaller than that distance, i.e. the first regions may be arranged around the pilot region in small distances, whereas in the area of the pilot region no such n doped first region is present. Thus, the mixed region, comprising first and second regions, enclose the pilot region, in which no first region is arranged, i.e. no first region is enclosed in the pilot region.

In each area on the emitter side, which lies in projection to one of the at least one pilot region, the plurality of source regions have a first area density. In each area on the emitter side, which lies in projection to the mixed region, the plurality of source regions have a second area density. The first area density is lower than the second area density, exemplarily lower than 50%, 10% or 5%. In an exemplary embodiment, no source region is arranged in projection to the pilot region. With the source regions being arranged in projection to the mixed region, the mixed region (or at least this part of the mixed region being arranged in projection to the source region, well layer and gate layer) is arranged in the active region.

An IGBT channel is formable from the source region, which is in contact to the emitter electrode, via the base layer to the drift layer, i.e. charges can flow from the emitter electrode to the drift layer. The above described inhomogeneity of the current (and carrier plasma concentration) in prior art BIGTs is improved in the inventive semiconductor design without reduction of the pilot-IGBT size by designing the emitter side of the BIGT to compensate the high current density due to the locally strong anode in the pilot region in such a way where there are no or a reduced number of IGBT channels located in the projected area of the pilot region. In the prior art devices, the same IGBT channels density inside and outside of the projection of the pilot region increases the current density above the pilot region, which is avoided or at least reduced in the inventive semiconductor devices, so that the carrier distribution is equalized in the inventive device. This may improve the reverse bias safe operating area (RBSOA), which is the safe operating conditions during the short time of the device turning into the off state. The device performance in diode mode is not affected, as the pilot region does not contain any of the cathode layers 1 and this device area is inactive.

In an exemplary embodiment, the space on the projected area of the pilot region on the emitter side may be used for a gate pad, by which the gate electrodes are commonly connected to an external contact.

Further preferred embodiments of the inventive subject matter are disclosed in the dependent claims.

BRIEF DESCRIPTION OF DRAWINGS

The subject matter of the invention will be explained in more detail in the following text with reference to the attached drawings, in which:

FIG. 1 shows a cross sectional view on a prior art reverse-conducting IGBT;

FIG. 2 shows a plan view of the structures of first and second regions of a reverse-conducting IGBT according to the invention;

FIG. 3 shows a plan view of the structures of first and second regions of another reverse-conducting IGBT according to the invention;

FIGS. 11-16 show plan views of the structures of cathode layers with first regions and anode layer with second and pilot regions of other reverse-conducting IGBT according to the invention; and FIGS. 17-19 show plan views of the structures of cathode layers with first regions and anode layers with second and pilot regions of other reverse-conducting IGBT according to the invention;

The reference symbols used in the figures and their meaning are summarized in the list of reference symbols. Generally, alike or alike-functioning parts are given the same reference symbols. The described embodiments are meant as examples and shall not confine the invention.

MODES FOR CARRYING OUT THE INVENTION

Figure 4:
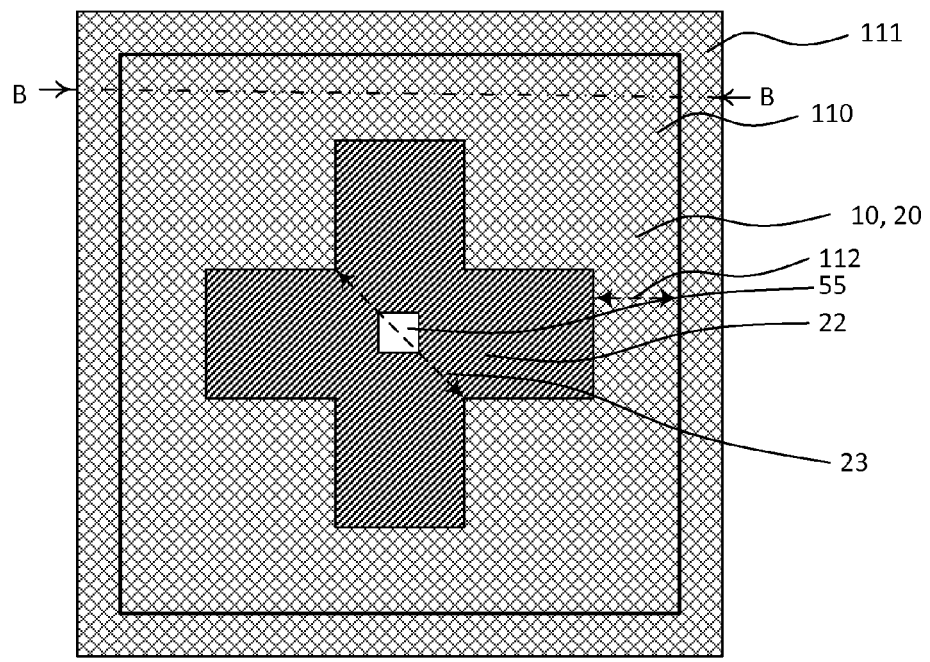
FIGS. 4 and 5 shows plan views of the structures of cathode layer with first regions and anode layer with second and pilot regions and a gate pad of other reverse-conducting IGBTs according to the invention.

In FIG. 1 a first embodiment of an inventive reverse-conducting semiconductor device 200, also named reverse-conducting insulated gate bipolar transistor (RC-IGBT) is shown. The RC-IGBT 200 comprises an n type base layer 101 with a first main side, which forms the emitter side 104 of the integrated IGBT, and a second main side opposite the first main side, which forms the collector side 103 of the integrated IGBT. The base layer 101 is that part of an (n−) doped wafer 100, which has a first low doping concentration, typically the un-amended doping in the finalized reverse-conducting insulated gate bipolar transistor. Alternatively, the device could also be manufactured starting from a p doped wafer, on which the base layer 101 is created, e.g. by epitaxial growing. In an exemplary embodiment, the base layer thickness 102 is the maximum vertical distance between the collector and emitter sides 103 and 104 of that part of the wafer with the first doping concentration (i.e. of the base layer 101). In an exemplary embodiment, the base layer thickness is at least 100 µm (for a device of about 1200 V), at least 300 µm (for a device of about 2500 V) and at least 500 um (for a device of about 4500 V).

A p type well layer 4 is arranged on the emitter side 104. At least one n type source region 3 is also arranged on the emitter side 104 and it is surrounded by the well layer 4. The at least one source region 3 has a higher doping than the base layer 101. An electrically insulating layer 6 is arranged on the emitter side 104 on top of the base layer 101, the well and source region 4, 3. It at least partially covers the at least one source region 3, the well layer 4 and the base layer 101. An electrically conductive gate layer 5 is arranged on the emitter side 104 electrically insulated from the at least one well layer 4, the source region 3 and the base layer 101 by an insulating layer 6. Exemplarily, the gate layer 5 is completely covered by the insulating layer 6.

Typically the insulating layer 6 comprises a first electrically insulating layer 61, preferably made of a silicon dioxide, and a second electrically insulating layer 62, preferably also made of a silicon dioxide, preferably of the same material as the first electrically insulating layer 61. The second electrically insulating layer 62 covers the first electrically insulating layer 61. For an RC-IGBT 200 with a gate layer 5 formed as a planar gate electrode 5' as shown is FIG. 1 the first electrically insulating layer 61 is arranged on top of the emitter side 104. In between the first and second electrically insulating layers 61, 62, which form the insulating layer 6, the gate layer 5, is embedded, typically it is completely embedded. Thus, the gate layer 5 is separated from the base layer 101, the source region 3 and the well layer 4 by the first electrically insulated layer 61. The gate layer 5 is typically made of a heavily doped polysilicon or a metal like aluminum. The planar gate electrode 5' comprises the gate layer 5 and the insulating layer 6.

The at least one source region 3, the gate layer 5 and the insulating layer 6 are formed in such a way that an opening is created above the well layer 4. The opening is surrounded by the at least one source region 3, the gate layer 5 and the insulating layer 6.

An emitter electrode 8 is arranged on the emitter side 104 within the opening so that it is in direct electrical contact to the well layer 4 and the source region 3. This emitter electrode 8 typically also covers the insulating layer 6, but is separated and thus electrically insulated from the gate layer 5 by the second electrically insulating layer 62.

An n type cathode layer 1 and a p type anode layer 2 are arranged on the collector side 103 and the cathode layer 1 has a higher doping concentration than the first doping concentration of the base layer 101. The cathode and anode layers 1, 2 can be arranged in the same plane or, alternatively, they can also be arranged in different planes, whereas the planes from the cathode and anode layer 1, 2 are spaced from each other, preferably at least by the thickness of that layer, which is arranged farer away from the collector side 103. Devices with such cathode and anode layers 1, 2 being arranged in different planes and their manufacturing methods are known from the European patent applications with filing numbers EP 07150162 and EP 07150165.

The semiconductor device comprises an active region 110 (central region) in a central part of the device 200 and a termination region 111, which surrounds the active region 110 up to the edge of the substrate or chip. The active region 110 is the area in which the device conducts current during on-state, in the case of an IGBT this is the MOS cell. The active region is that area within the wafer 100, which includes the source region 3 and well layer 4 and is arranged below the source region 3, well layer 4 and gate layer 5. With below the area is meant which is arranged in the wafer 100 between the emitter side 104 and the collector side 103, in which area any of the source region 3, well layer 4 or gate layer 5 are arranged.

In the termination area 111, typically first and second regions 10, 20 are arranged on the collector side 103, but alternatively this region may also consist of a single n doped region or of a single p doped region. Within the termination area, where first and second regions 10, 20, or only the single n or p region on the collector side 103 are arranged, neither a source region 3, a well layer 4 nor a gate electrode is arranged on the emitter side 104.

A collector electrode 9 is arranged on the collector side 103 and it is in direct electrical contact to the at least one cathode and anode layers 1, 2. Typically, Ti, Ni, Au or Al are chosen as a material for the collector electrode 9.

In the inventive RC-IGBT 200 a diode is formed between the emitter electrode 8, which forms an anode electrode in the diode, the well layer 4, part of which forms an anode layer of the diode, the base layer 101, part of which forms a base layer for the diode, the n type cathode layer 1 and which layer forms a cathode layer, and the collector electrode 9, which forms a cathode electrode.

In the inventive RC-IGBT 200 an insulated gate bipolar transistor (IGBT) is formed between the emitter electrode 8, which forms an emitter electrode in the IGBT, the source region 3, which forms a source region, the well layer 4, part of which forms a channel region, the base layer 101, part of which forms a base region for the IGBT, the p type anode layer 2, and the collector electrode 9, which forms a collector electrode.

Figure 9:
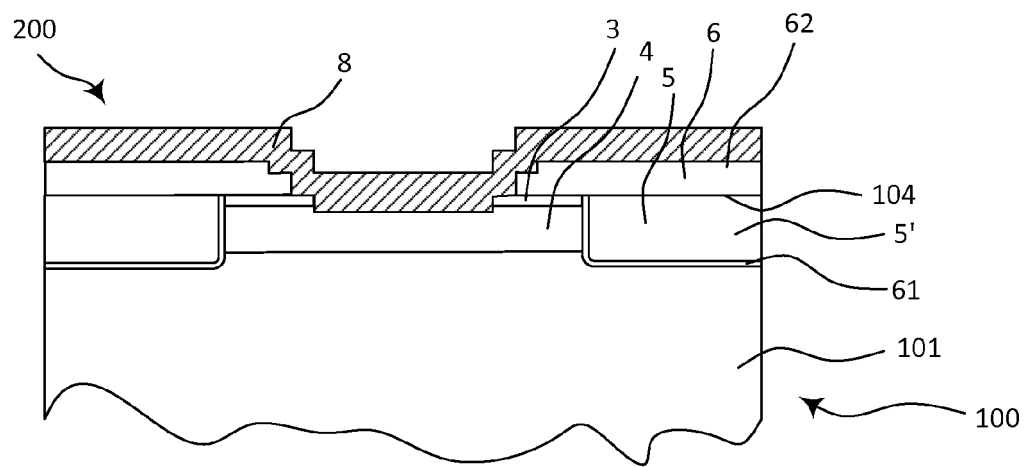
FIG. 9 shows the layers on the emitter side of another inventive reverse-conducting IGBT with trench gate electrodes.

Alternatively to the inventive RC-IGBT with a planar gate electrode 5', the inventive RC-IGBT may comprise a gate layer 5, formed as trench gate electrode 5" as shown in FIG. 9. The trench gate electrode 5" is arranged in the same plane as the well layer 4 and adjacent to the source region 3, separated from each other by a first insulating layer 61, which also separates the gate layer 5 from the base layer 101. A second insulating layer 62 is arranged on top of the gate layer 5 formed as a trench gate electrode 5", thus insulating the gate layer 5 from the emitter electrode 8.

Any of the first, second and pilot regions has a region width and a region area, which is surrounded by a region border.

In an exemplary embodiment, a shortest distance is the minimum length between a point within said region area and a point on the region border. The region width is measured in a plane parallel to the collector side 103. Each region width in this exemplary embodiment is defined as two times the maximum value of all shortest distances within said region.

The n type cathode layer 1 comprises at least one or a plurality of first regions 10, wherein each first region 10 has a first region width 11. Typically the cathode layer 1 comprises a plurality of first regions 10.

The p type anode layer 2 comprises at least one or a plurality of second regions 20 and at least one or a plurality of pilot regions 22, wherein each second region 20 has a second region width 21 and the pilot region 22 has a pilot region width 23.

FIG. 2 shows a cut through the cathode and anode layer 1, 2 along the line B-B from FIG. 1. This line is also indicated in FIG. 2 in order to show that the RC-IGBT does not have the same structure for the cathode and anode layer 1, 2 over the whole plane of the wafer 100. There are parts in which the cathode and anode layer 1, 2 only comprises first and second regions 10, 20 as shown in FIGS. 2 and 3 and which are also present in the FIGS. 6, 7 and 8 e.g. along the line B-B. In other parts of the RC-IGBT 200, the on the collector side 103, only a pilot region 22 is arranged, which contacts the collector electrode 9.

Each pilot region area is an area, in which any two first regions 10, which are arranged on the border of the pilot region 22, have a distance between two neighboured first regions 10 on the pilot region border smaller than two times the base layer thickness 102. That means that the at least one first region 10 surrounds the at least one pilot region 22 in a plane parallel to the emitter side 104 such that an n doped area (i.e. first region(s)), which has at least one opening (i.e. in which p doped second regions 20 are arranged) of less than two times the base layer thickness 102 or which has no such openings, surrounds the at least one pilot region 22. This shall include the option that the first region 10 is a continuous region surrounding the pilot region 22 in a plane parallel to the emitter side 104 or by having a first region formed as an open ring having an opening smaller than two times the base layer thickness 102. By having an n doped area around the pilot region 22, p doped areas have a width of less than two times the base layer thickness 201 (and thus form second regions 20) are arranged.

In the pilot region 22, no first region is arranged or enclosed. Across the pilot region 22, the first regions 10 have a distance of more than two times the base layer thickness 102. That means that the pilot region 22 may be enclosed by first regions 10 which have a smaller distance to each other, but across the pilot region area, the distance between any two first regions 10 may be larger than two times the base layer thickness 102. In other exemplary embodiments, each pilot region area has a width larger than 2.5, in particular 3 times or 4 times the base layer thickness 102. The at least one second region is that part of the anode layer 2, which is not the at least one pilot region 22.

The pilot region 22, i.e. the p doped area, in which the width is bigger than two times the base layer thickness 102, is arranged in the central part of the device in such a way that there is a minimum distance between the pilot region border to the interface between the active region and the termination region of at least once the base layer thickness 102, in particular twice the base layer thickness 102. The sum of the areas (total area) of the at least one pilot region 22 is between 10% and 45% of the area of the mixed region 10, 20, exemplarily between 11 and 43%. Furthermore, each first region width 11 is smaller than the base layer thickness 102.

For a device, in which in projection to the pilot region 22 source regions 3 are arranged, the pilot region 22 becomes part of the active region 110 and the pilot region area may be between 10 to 30% of the active region area.

The pilot region has a pilot region area such that a circle (p doped area) having a diameter of at least two times the base layer thickness 102 can be laid into the pilot region over the whole region area in a plane parallel to the emitter side 104. No n doped region 10 is enclosed in this p doped pilot region 22. The first regions 10 are arranged on the pilot region border in a distance from each other smaller than twice the base layer thickness 102, exemplarily once the base layer thickness 102.

In an exemplary embodiment, the width of the pilot region may be at least 200 µm, at least 500 µm or at least 1000 µm. In another exemplary embodiment, the pilot region width may be at least 2, 2.5, 3 or 4 times the base layer thickness 102.

The second regions 20 and the first regions 10 form shorted regions. The second regions 20 are p doped regions, which are not a pilot region 22. In another exemplary embodiment, at least one second region width 21 is equal to or larger than one time the base layer thickness 102 (but smaller than two time the base layer thickness 102), in particular each second region width 21 is equal to or larger than the base layer thickness 102, and each first region width 11 is smaller than the base layer thickness 102.

In another exemplary embodiment the total area of the second and pilot regions 20, 22 to total area of the wafer 100 in the central region (i.e. pilot region area plus first and second region area, which is part of active region 110) is between 70% up to 90%. In such a device the total area of the first regions 10 to the area of the second region 20 plus pilot region 22 is between 10% to 45% (which corresponds to 10 to 30% of the central area).

In a further preferred embodiment the total area of the at least one pilot region 22 is between 18 to 33% and exemplarily between 22 to 28% % of the mixed region (i.e. 15 to 25 or 18 to 22, around 20% of the central area).

Typical designs for the first and second regions 10, 20 are a stripe design (as shown in FIGS. 2, 17 and 22, 23) However, any appropriate design may be used for the first and second regions.

The widths 11, 21 of the shorted first and/or second regions 10, 20 can be constant over the whole wafer area so that the first and pilot regions 10, 20 are arranged in a regular geometrical manner over the wafer 100 as e.g. shown in the FIGS. 2 and 3, but their widths may also vary over the wafer 100. In case of the second regions 20 being formed as stripes, the stripes can be surrounded be first regions as shown in FIG. 3.

Figure 17:
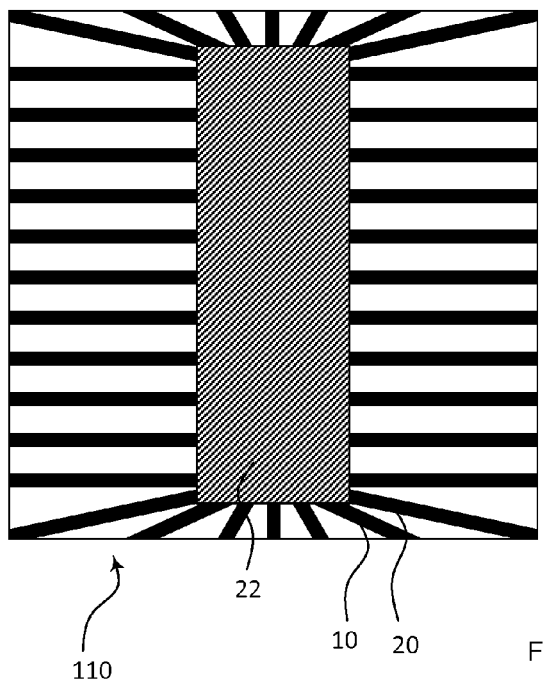
Figure 20:
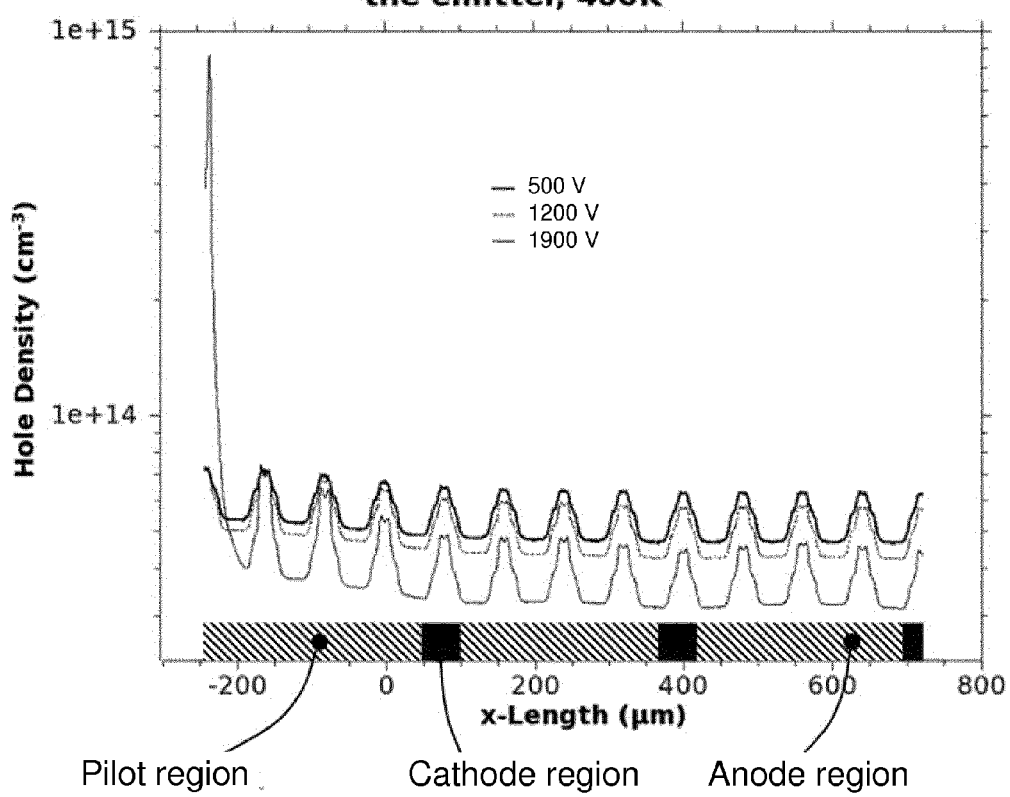
FIGS. 20-21 show carrier plasma (hole density) concentration in the prior art devices in a plane located 5 µm from the emitter during IGBT mode turn-off.
Figure 21:
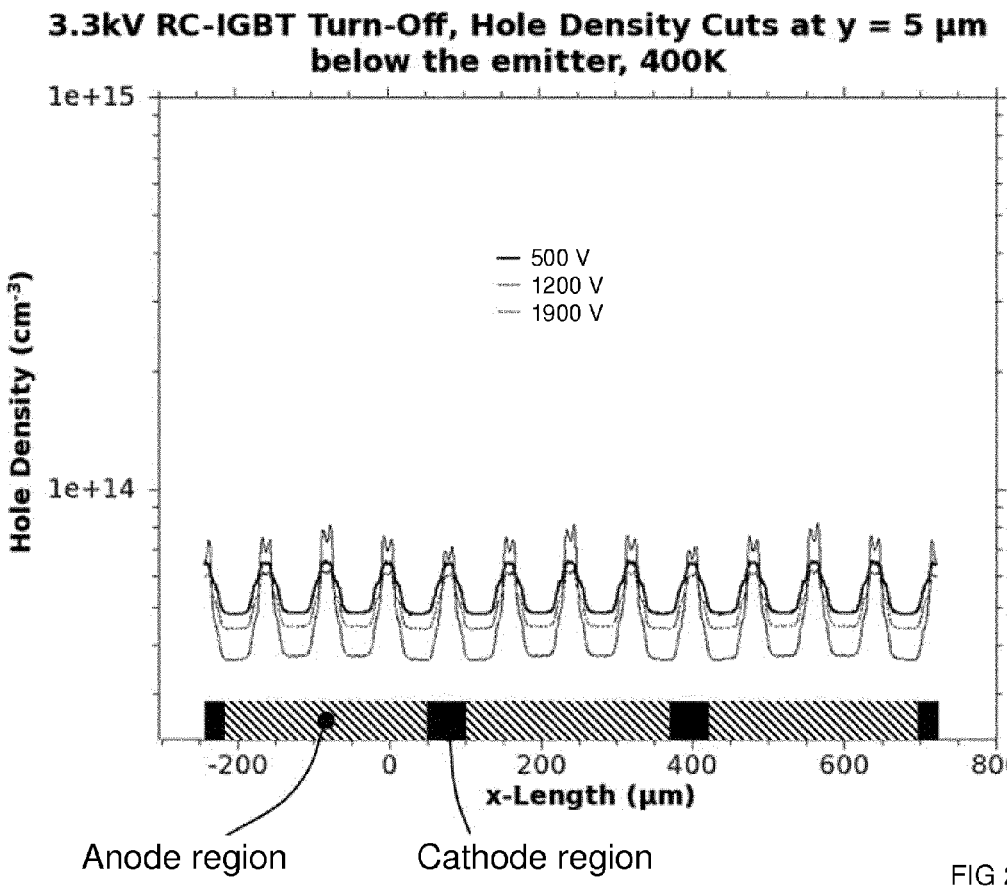
Figure 22:
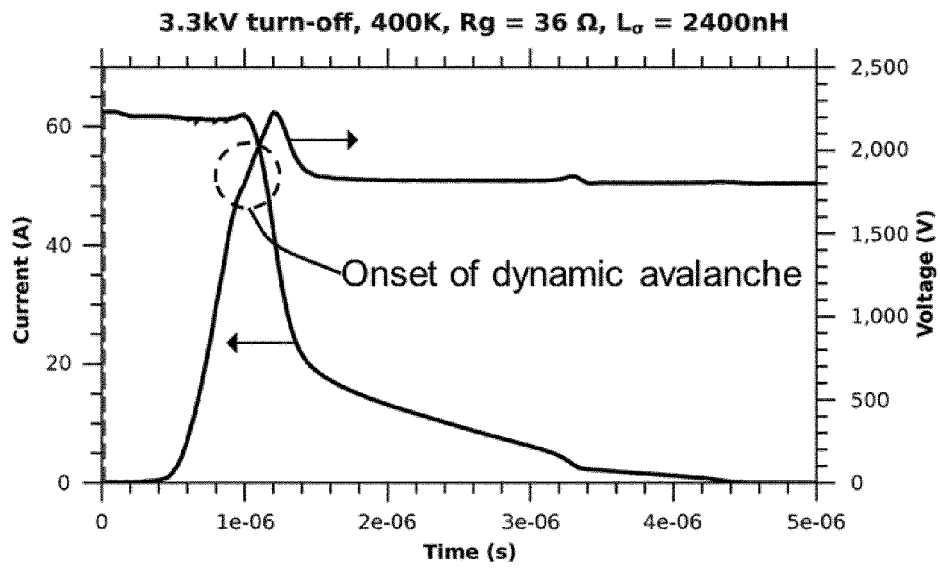
FIG. 22 shows an example of a BIGT turn-off waveform showing the onset of dynamic avalanche.

In the FIGS. 17 to 19 only the active region 110 of the device is shown. The termination region 111, in which typically first and second regions 10, 20 are arranged, but alternatively this region may also consist of an n doped region or of a p doped region, surrounds the active region 110.

By the presence of a large pilot region 22 in the device the initial snap-back is removed. As the remaining second regions 20 have smaller dimensions, a secondary snap-back may be present when these p doped regions are turned on one after the other and cause negative resistance jumps in the on-state characteristics. By having a second region 20 with a greater width close to the pilot region and by decreasing the widths of the subsequent second regions, a smooth transition is achieved, by which the snap-back effect is further lowered or even avoided.

In each area on the emitter side 104, which lies in projection (directly opposite) to a pilot region 22, the plurality of source regions 3 have a first area density 31. In each area on the emitter side 104, which lies in projection to the mixed region (first and second regions 10, 20), the plurality of source regions 3 have a second area density 31. The first area density 31 is lower than the second area density 32. That means that in the projection of the pilot region 22 on the emitter side 104, either no source region is arranged or at least the area density of the source regions is much smaller than in a projection of the mixed region. "In projection" shall mean that an area or layer is arranged parallel to another layer/area and to the collector side 103. The layers/areas lie directly opposite to each other without a lateral shift.

In other exemplary embodiments, the first area density 31 is lower than 50% or lower than 10% or lower than 5% of the second area density 32. In another exemplary embodiment, there is no source region 3 arranged in projection to the pilot region 22. In this case, the region in projection to the pilot region 22 does not contribute to the active region 110 of the device, but the pilot region 22 is enclosed by the mixed region 10, 20, which is part of the active region 110.

Figure 23:
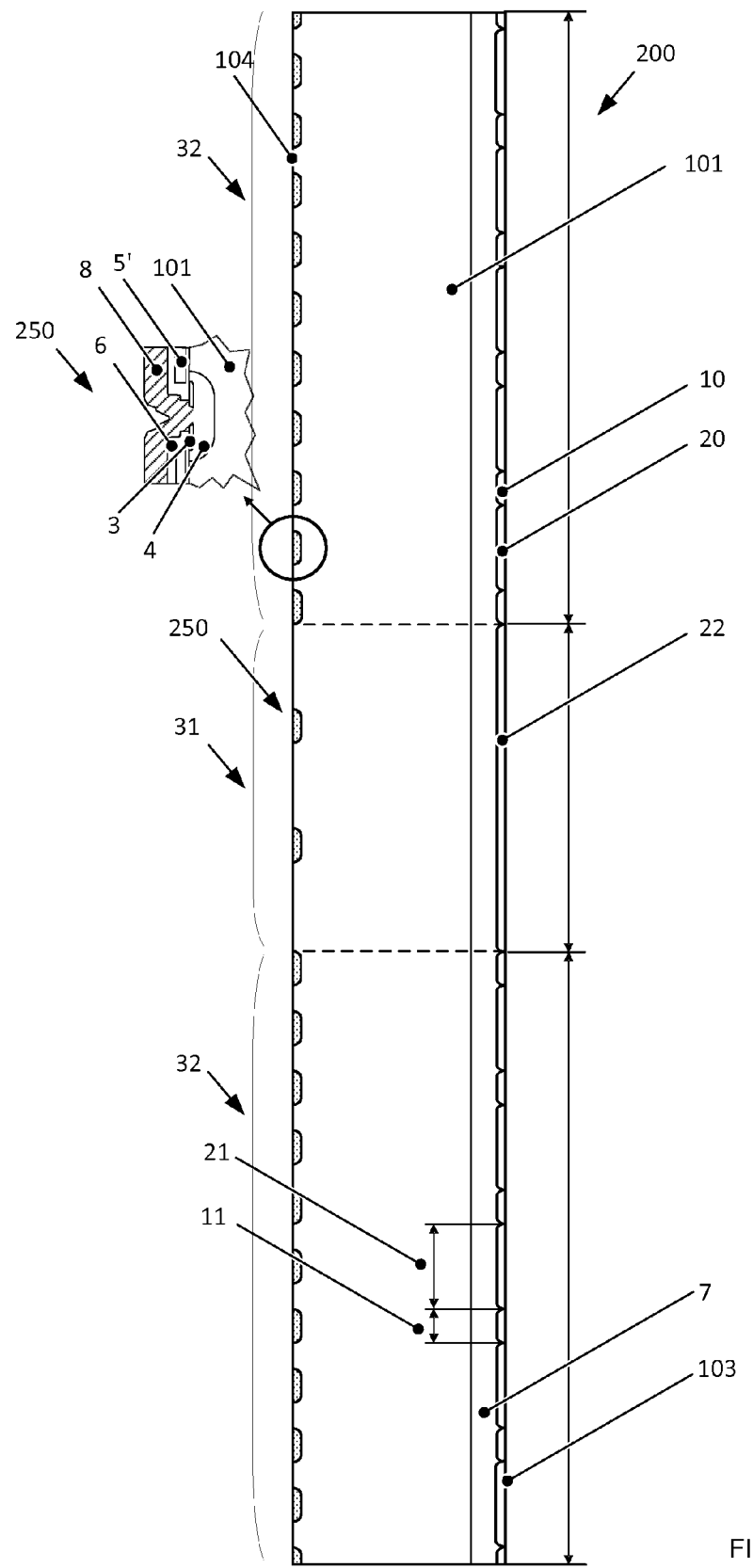
FIG. 23 shows a cross sectional view on of a reverse-conducting IGBT according to the invention.

FIG. 23 shows a cross sectional view on an inventive RC-IGBT. In the middle part of the figure, a pilot region 22 is arranged, above which (i.e. in projection to which) the source regions 3 have a reduced first area density 31 compared to second area density 32 in the area, in which mixed first and second regions 10, 20 are arranged on the collector side 103. For clarity reasons, in the figures on the emitter side 104 MOS cells 250 are shown substitutionally for the source regions 3 and thus, for the density of the source regions 31, 32. Each MOS cell 250 comprises a gate electrode 5', source region 3 and well layer 4 as well as a contact of the source region 3 and well layer 4 to the emitter electrode 8 so that a channel is formable from the emitter electrode 8 to the base layer 101. The figure shows a reduced first are density 31, but above the pilot region 22 also no source regions at all may be arranged.

Figure 5:
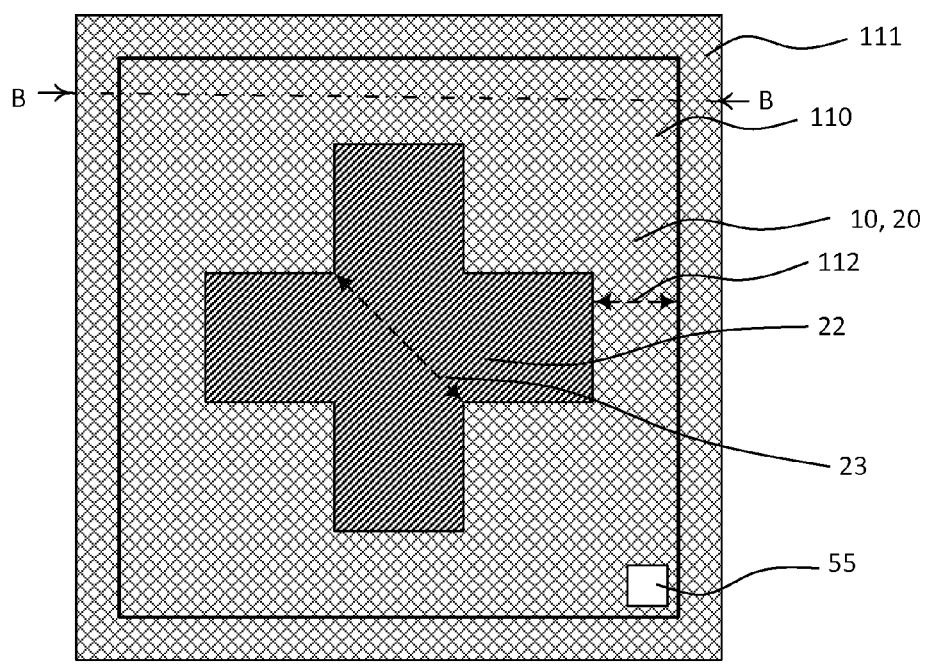

In this area opposite to a pilot region 22, i.e. in projection to the pilot region 22, a gate pad 55 for an external contact of the gate electrode 5 may be arranged on the emitter side 104 (FIG. 4). A gate pad 55 is used for electrically connecting the gate electrode 5 to an external contact. Such a gate pad 55 is exemplarily arranged in the active region 110 of the device. As in this region no or at least a reduced area is used for the source regions, space is available for such a gate pad 55, freeing active area where it is needed. Alternatively, such a gate pad 55 may be arranged independently at any other place within the active region 110, e.g. in a corner of the active region 110 (FIG. 5).

Figure 14:
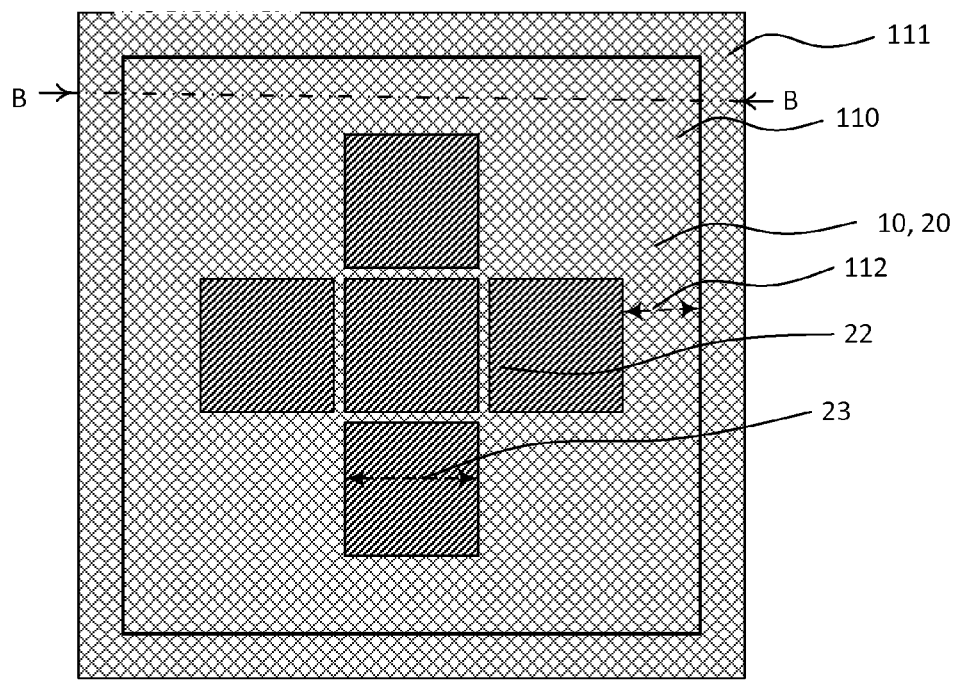
Figure 15:
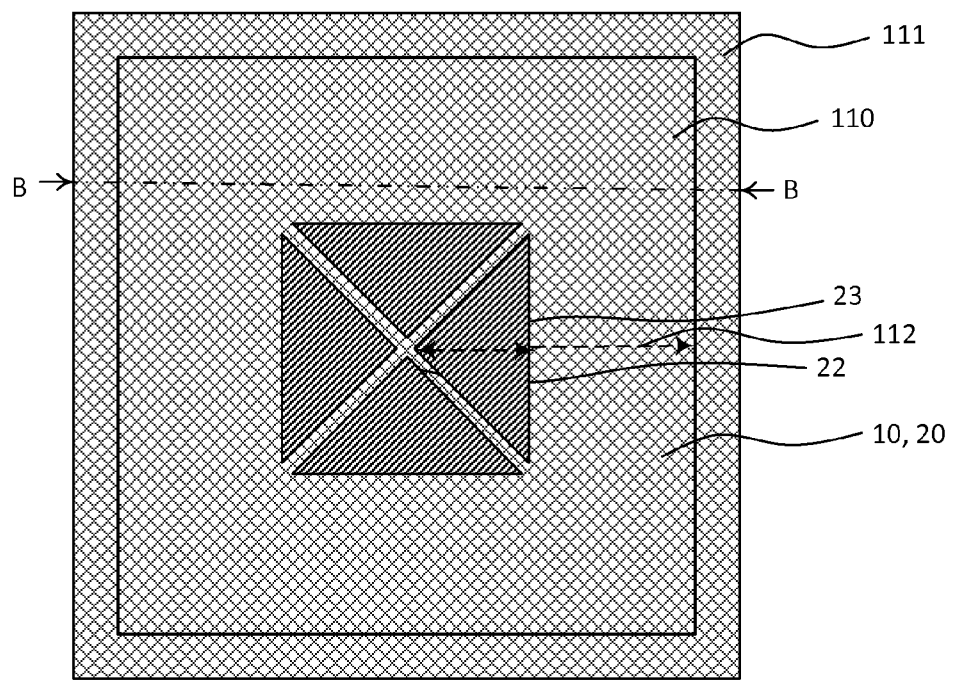

In an exemplary embodiment, the pilot region 22 consists of a single region (as shown in the FIGS. 6, 7, 8, 11, 12 and 13). The pilot region may alternatively also comprise a plurality of regions, which are separated from each other by at most twice the base layer thickness 102, in particular by at most one time the base layer thickness 102 (FIGS. 14, 15, 16). In case of the pilot region 22 comprising a plurality of regions, typically first regions 10 are arranged between two regions belonging to the pilot region 22 or at least the intermediate space comprises first regions 10, i.e. the intermediated space comprises first and second regions 10, 20.

In another exemplarily embodiment the first regions 10 are arranged as stripes over the wafer 100. A plurality of stripes is arranged in a row and a plurality of such rows are arranged in columns within the active region 110 (FIG. 2).

In another exemplary embodiment the pilot region 22 is connected to each second region 20 within the active region 110 (FIG. 17).

The pilot region or regions 22 has in another preferred embodiment a square, rectangular, circular, star, diamond, tri-star or polygonal shape like a hexagon or another polyangular design.

Figure 6:
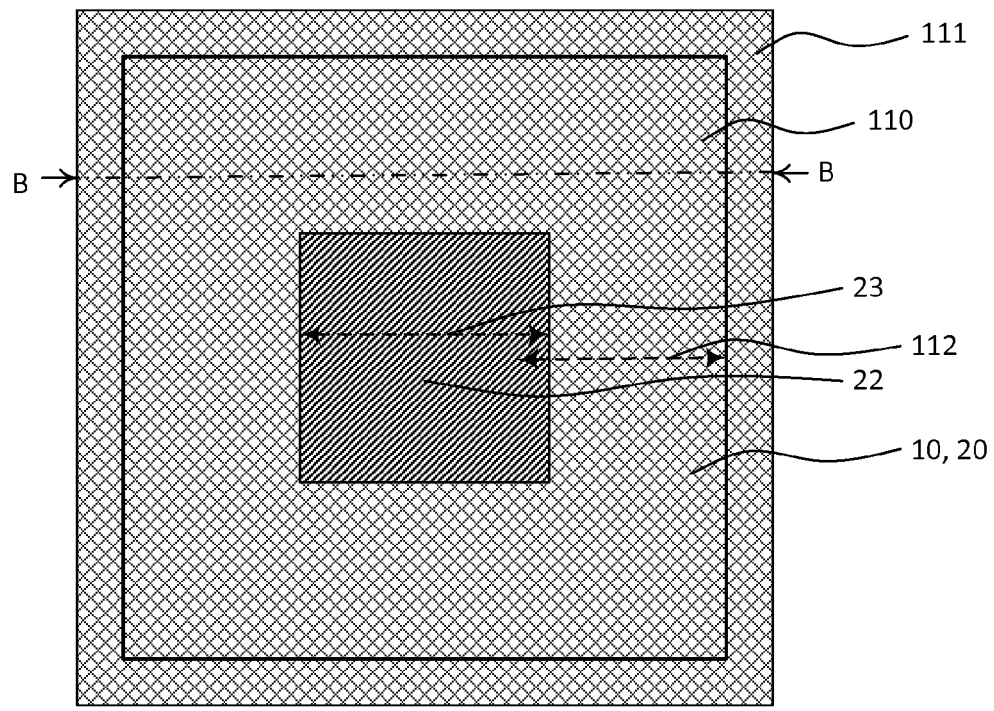
FIGS. 6-8 shows plan views of the structures of cathode layers with first regions and anode layer with second and pilot regions of other reverse-conducting IGBTs according to the invention.
Figure 7:
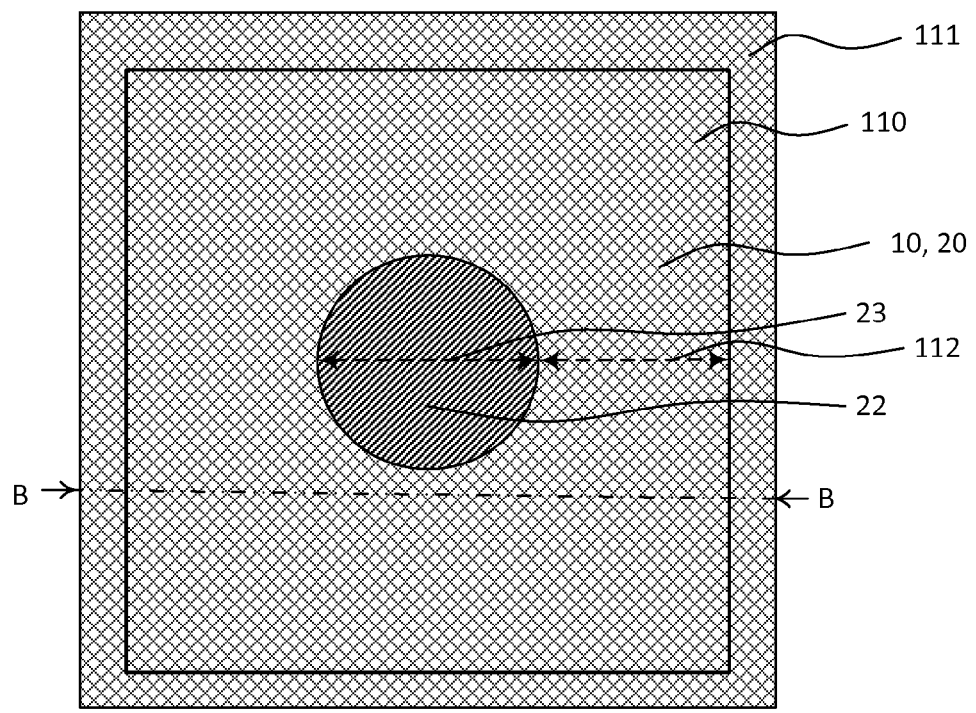

FIG. 6 shows such a pilot region 22 with a square shape, whereas FIG. 7 shows a pilot region 22 with a circular shape. In the FIGS. 6 to 8, the first and second regions 10, 20 are only indicated by hatching of the area designated with 10, 20 for clarity reasons, but the hatched area is meant to be an area of alternating first and second regions 10, 20 as e.g. shown in FIGS. 2 and 3.

A shortest distance is the minimum length between a point within said region area and a point on said region border. The maximum value of all possible shortest distances (i.e. any possible distance) within said region is for a square design (FIG. 6) the distance between the central point of the square to the middle point of any of the border lines. This is the longest distance to equalize charge during switching of the device. The region width is defined as two times this maximum value, i.e. the width is the length of the edge of the square.

For a circular shape of the pilot region 22 as shown in FIG. 7 the pilot region width 23 corresponds to the diameter of the pilot region (again the maximum value is measured from the central point of the circle to any point on the border of the circular pilot region.

Figure 8:
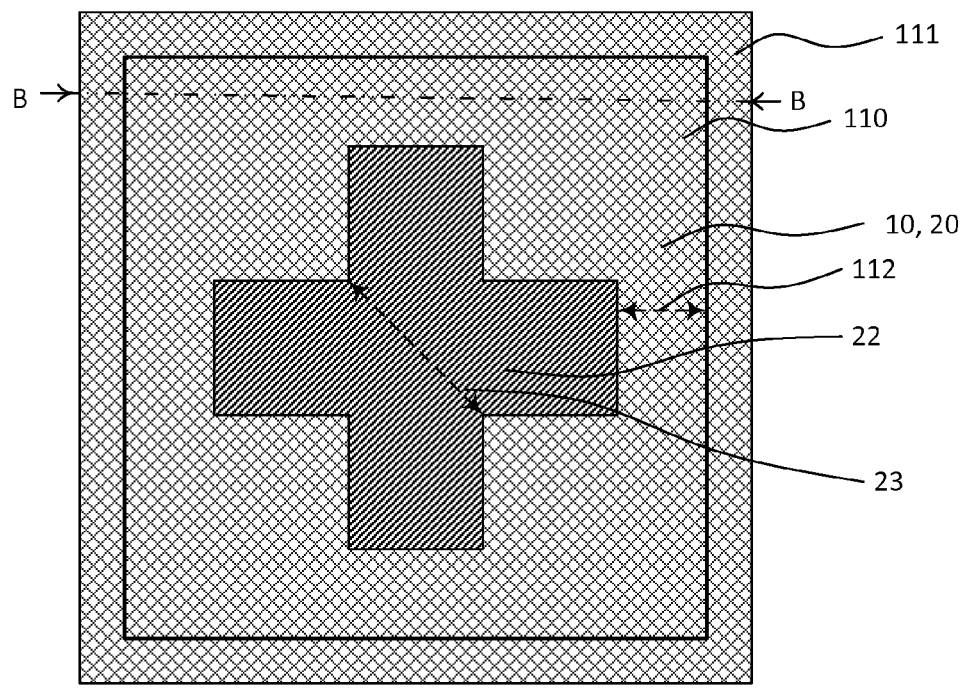

By the pilot region 22 having a star shape with elongated fingers (protrusions) as for example with the cross shape the heat distribution can be improved, because the heat produced in this IGBT area without the necessity of increasing the size of the pilot region 22. Star shape shall mean any central area of a region, which is surrounded by protrusions (fingers) with at least three such protrusions. A cross as shown in FIG. 8 is formed by four such protrusions. Of course, also another number of fingers than four can be used in a star design as three fingers in a triangle (three armed star or tri-star shape) or five or more fingers in the star design.

In an exemplary embodiment, fingers shall be understood as areas, in which the width is smaller than the length of that area. Such fingers can be formed as a cross (FIG. 8), but of course also another number of fingers than 4 can be used as three fingers in a triangle or 5 or more fingers in a star design.

FIG. 8 show the second pilot region 22 in form of a cross. For explaining what the maximum value (pilot region width 23) of the shortest distance is for this case, the cross is hypothetically divided into four outer rectangles and a central rectangle. The maximum value of any shortest distance between a point within the cross region to the border of the cross region exists from the middle point of the central rectangle of the cross to one of the four points, on which two adjacent outer rectangles adjoin. The pilot region width 23, which is two times this maximum value, is shown as a dashed line. The maximum value is the longest way an electron or hole has to flow in order to charge or discharge the region if the device is switched between on/off or vice versa.

FIG. 18 shows another exemplary embodiment of the inventive device, in which the pilot region 22 in square design is connected to second regions 20, which extend to the border of the active region 110. In case of the device comprising a plurality of pilot regions 22, these regions 22 are interconnected to one another by second regions 20. In another exemplary embodiment, the second regions 20, which expand to the border of the active region 110, are arranged radial between the at least pilot region and the border of the active region. By "radial" it is meant that the second regions are arranged star like around the pilot region 22 such that the second regions are short connections to the border of the active region. FIG. 19 shows the pilot region in a cross design and FIG. 17 in a stripe design. In these figures, only a part of the second regions radiate from the pilot region border to the active region border and thus form shortest connections. E.g. in the corners of a square, rectangle or a star, the second regions extend such that the distance between the first regions does not get to large (i.e. the geometrical rules for first region distances are fulfilled).

By the presence of a large pilot region as a pilot region in the device with a width of at least two times the base layer thickness the initial snap-back is removed. Due to the smaller size of the second regions a secondary snap-back may be present when these p doped regions are turned on one after the other and cause negative resistance jumps in the on-state characteristics, if the second regions are disconnected from the pilot region. By having the pilot region connected to second regions, and by radial extending the second regions between the pilot region to the interface between the active region and the termination region, the snap-back effect is further lowered or even avoided.

As also shown in FIG. 1, in another embodiment the RC-IGBT 10 may further comprise an n type buffer layer 7, which is arranged between the base layer 101 and the cathode and anode layer 1, 2 respectively, and which buffer layer 7 has a higher doping concentration than the base layer 101.

The buffer layer 7 has preferably a maximum doping concentration of at most $1*10^{16}$ cm$^{-3}$.

Figure 10:
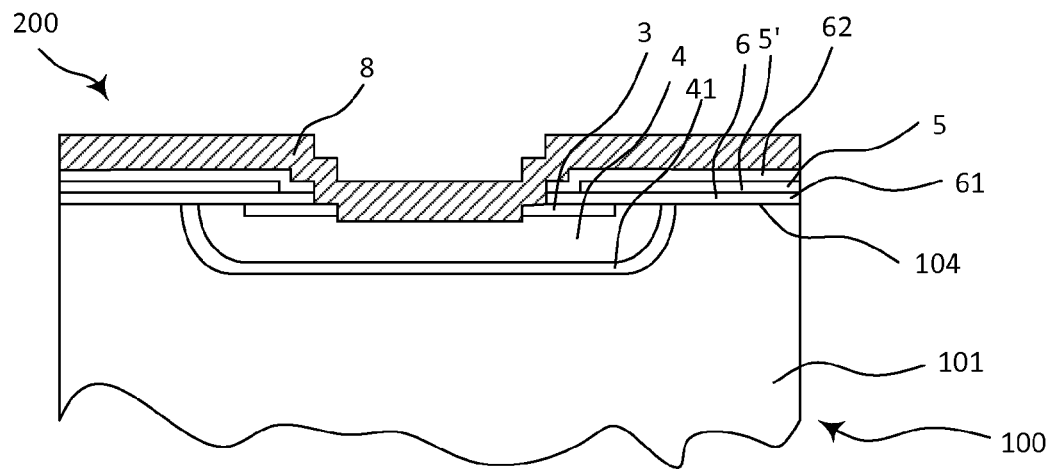
FIG. 10 shows the layers on the emitter side of another inventive reverse-conducting IGBT with an enhancement layer.
Figure 11:
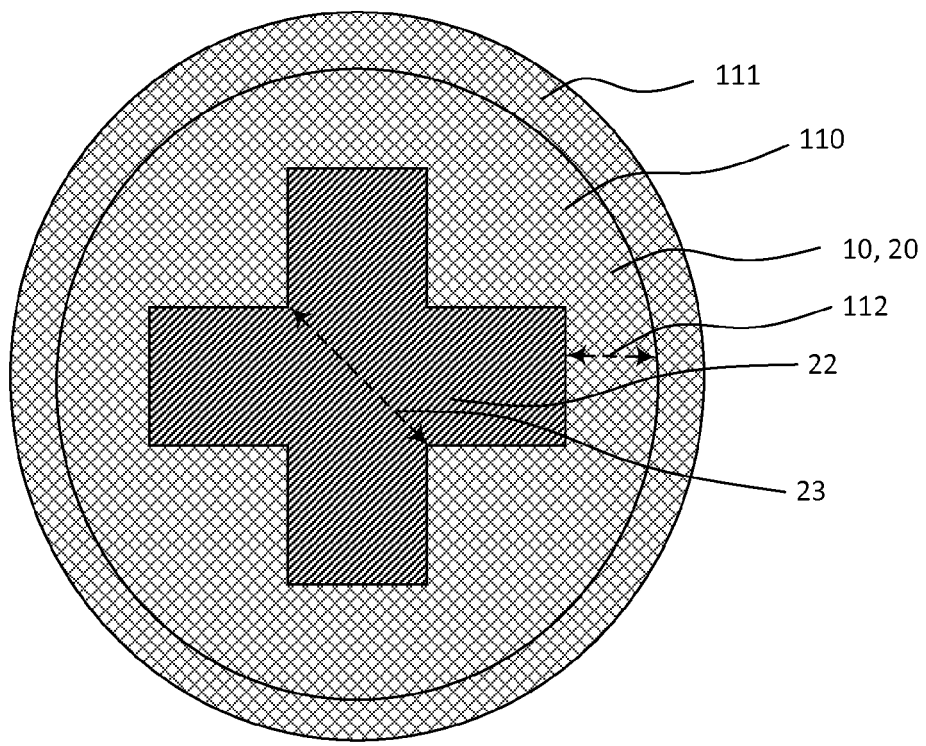
Figure 12:
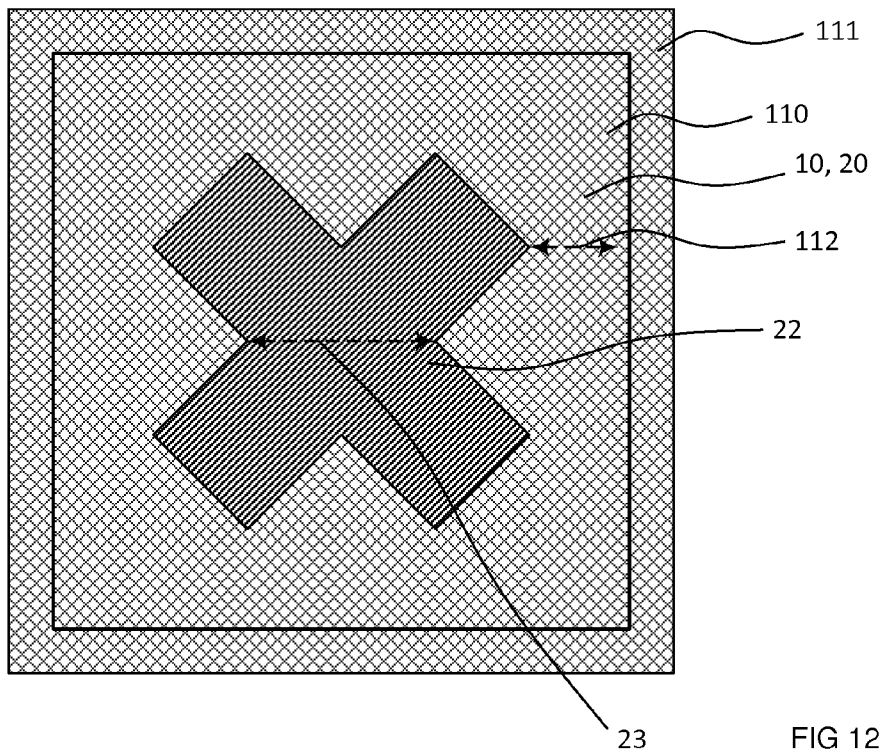
Figure 13:
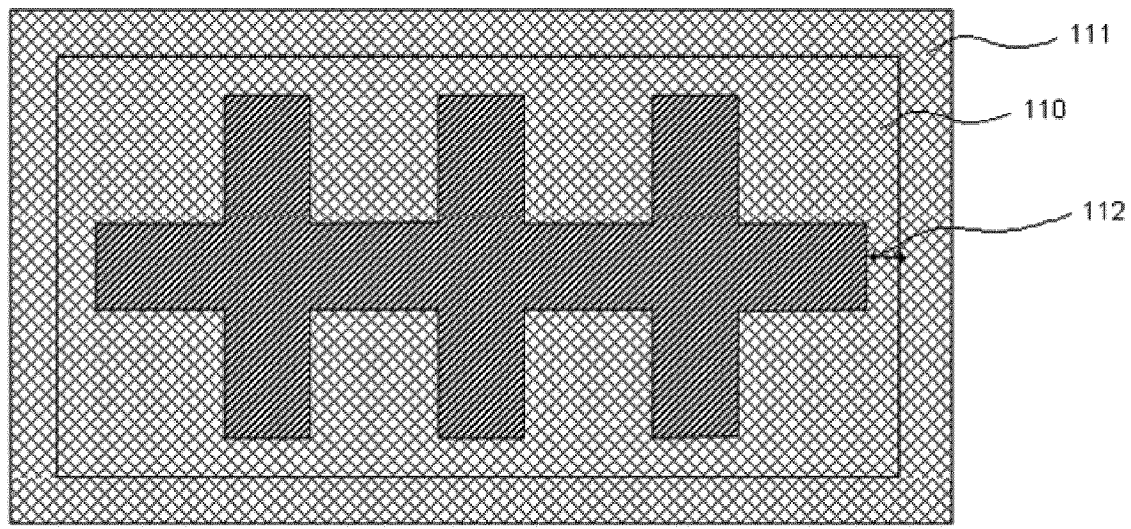

In another preferred embodiment shown in FIG. 10, an n doped enhancement layer 41 is arranged between the well layer 4 and the base layer 101 for having lower on-state losses. The enhancement layer 41 separates the well layer 4 from the base layer 101 and it has higher doping concentration than the base layer 101. The enhancement layer 41 can be present in planar gate designs as well as in trench gate designs.

In another embodiment, the conductivity types of the layers are switched, i.e. all layers of the first conductivity type are p type (e.g. the base layer 101) and all layers of the second conductivity type are n type (e.g. the well layer 4).

The inventive reverse-conducting semiconductor device 200 can for example be used in a converter.

REFERENCE LIST 1 cathode layer
10 first region
11 width of first region
2 anode layer
20 second region 21 width of second region
22 pilot region
23 width of pilot region
3 source region
31 First area density
32 Second area density
4 well layer
41 enhancement layer
5, 5' gate layer
55 gate pad
6 insulating layer
61 first electrically insulating layer
62 second electrically insulating layer
7 buffer layer
8 emitter electrode
9 collector electrode
100 wafer
101 base layer
102 base layer thickness
103 collector side
104 emitter side
110 Active region
111 termination area
112 Distance between pilot region border to active region border
200 RC-IGBT
250 MOS cell

The invention claimed is:

1. A Reverse-conducting semiconductor device, which comprises a freewheeling diode and an insulated gate bipolar transistor on a common wafer, part of which wafer forms a base layer of a first conductivity type with a first doping concentration and a base layer thickness, wherein the insulated gate bipolar transistor comprises a collector side and an emitter side opposite to the collector side of the wafer, wherein the base layer thickness is the maximum vertical distance between the collector and emitter side of that part of the wafer with the first doping concentration, a cathode layer of the first conductivity type and higher doping concentration than the first doping concentration, and an anode layer of a second conductivity type, which is different from the first conductivity type, are alternately arranged on the collector side, wherein a plurality of source regions of the first conductivity type, a well layer of the second conductivity type and a gate electrode having an electrically conductive gate layer, which is insulated from any layer of the first or second conductivity type by a first insulating layer, are arranged on the emitter side, wherein the cathode layer comprises at least one first region, wherein each first region has a first region width, wherein the anode layer comprises at least one second region, wherein each second region has a second region width, and at least one pilot region, wherein each pilot region has a pilot region width, wherein any region has a region width and a region area, which is surrounded by a region border, wherein a shortest distance is the minimum length between a point within said region area and a point on said region border, each region width is defined as two times the maximum value of all shortest distances within said region, the reverse-conducting semiconductor device comprises an active region in a central part of the device, which active region is an area within the wafer, which includes and is arranged in projection of the source region, well layer and gate layer, wherein each pilot region area is an area having a width of at least two times the base layer thickness, wherein the pilot region is laterally surrounded on the pilot region border by first regions, which have a distance from each other of less than two times the base layer thickness, wherein the at least one second region is that part of the anode layer, which is not the at least one pilot region, wherein a mixed region comprises the at least one first and second regions, wherein the at least one pilot region is arranged in the central part of the device such that the mixed region laterally surrounds the at least one pilot region, wherein the mixed region has a width of at least once the base layer thickness, wherein the total area of the at least one pilot region is between 10% and 45% of the area of the mixed region, wherein each first region width is smaller than the base layer thickness, in each area on the emitter side, which lies in projection to one of the at least one pilot region, the plurality of source regions have a first area density, wherein in each area on the emitter side, which lies in projection to the mixed region, the plurality of source regions have a second area density, wherein the first area density is lower than the second area density.

2. The Reverse-conducting semiconductor device according to claim 1, wherein the first area density is at most 50% of the second area density.

3. The Reverse-conducting semiconductor device according to claim 2, wherein the total area of the first region to the area of the second region plus pilot region is between 10% and 45%.

4. The Reverse-conducting semiconductor device according to claim 1, wherein the first area density is zero.

5. The Reverse-conducting semiconductor device according to claim 1, wherein a gate pad for an external contact of the gate electrode is arranged on the emitter side overlapping a projection to one of the at least one pilot region.

6. The Reverse-conducting semiconductor device according to claim 1, wherein at least one or each second region width is larger than the base layer thickness.

7. The Reverse-conducting semiconductor device according to claim 1, wherein each pilot region area has a width of at least 2.5 times the base layer thickness.

8. The Reverse-conducting semiconductor device according to claim 1, wherein the pilot region has a square, rectangular, circular, star, diamond or hexagon shape.

9. The Reverse-conducting semiconductor device according to claim 8, wherein the pilot region has one of a star shape with three protrusions forming a tri-star, four protrusions forming a cross or five or more protrusions.

10. The Reverse-conducting semiconductor device according to claim 1, wherein the at least one pilot region is connected to at least one or each second region.

11. The Reverse-conducting semiconductor device according to claim 10, wherein the at least one pilot region is one of a single pilot region or at least two pilot regions interconnected to each other via second regions and wherein the single pilot region or the at least two pilot regions are connected to second regions, which extend to the border of the active region.

12. The Reverse-conducting semiconductor device according to claim 1, wherein the total area of the first regions to the area of the second region plus pilot region is between 10% and 45%.

13. The Reverse-conducting semiconductor device according to claim 1, wherein
the total area of the at least one pilot region is between 18% and 33% of the mixed region.

14. The Reverse-conducting semiconductor device according to claim 1, wherein
the at least one pilot region consists of one of a single region or the at least one pilot region comprises a plurality of regions which are separated from each other by at most twice the base layer thickness.

15. The Reverse-conducting semiconductor device according to claim 14, wherein
the at least one pilot region comprises a plurality of regions which are separated from each other by at most once the base layer thickness.

16. The Reverse-conducting semiconductor device according to claim 1 wherein
the mixed region has a width of at least twice the base layer thickness.

17. The Reverse-conducting semiconductor device according to claim 1, wherein
the gate electrode is formed as one of a trench gate electrode or a planar gate electrode.

18. The Reverse-conducting semiconductor device according to claim 1, wherein each pilot region area has a width of between 3 and 4 times the base layer thickness.

19. The Reverse-conducting semiconductor device according to claim 1, wherein the first area density is at most 10% of the second area density.

20. The Reverse-conducting semiconductor device according to 1, wherein the total area of the at least one pilot region is between 22 and 28% of the mixed region.

* * * * *